United States Patent
Obiraki et al.

(10) Patent No.: US 8,258,618 B2
(45) Date of Patent: Sep. 4, 2012

(54) POWER SEMICONDUCTOR MODULE

(75) Inventors: Yoshiko Obiraki, Tokyo (JP); Seiji Oka, Tokyo (JP); Takeshi Oi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 375 days.

(21) Appl. No.: 12/577,376

(22) Filed: Oct. 12, 2009

(65) Prior Publication Data

US 2010/0127389 A1 May 27, 2010

(30) Foreign Application Priority Data

Nov. 26, 2008 (JP) ................................ 2008-301065

(51) Int. Cl.
*H01L 23/48* (2006.01)
(52) U.S. Cl. ........ 257/697; 257/698; 257/693; 257/150; 257/177
(58) Field of Classification Search .................. 257/697, 257/698, 693, 150, 177; 438/121, 122, 124, 438/126, 127
See application file for complete search history.

(56) References Cited

U.S. PATENT DOCUMENTS

| | | | | |
|---|---|---|---|---|
| 5,767,579 | A * | 6/1998 | Kanazawa et al. | 257/717 |
| 6,661,645 | B1 * | 12/2003 | Sakai et al. | 361/523 |
| 6,720,500 | B1 * | 4/2004 | Inoue | 174/258 |
| 7,589,412 | B2 | 9/2009 | Kashimoto et al. | |
| 7,816,781 | B2 * | 10/2010 | Thoben et al. | 257/693 |
| 2001/0028108 | A1 | 10/2001 | Higashi et al. | |
| 2003/0107131 | A1 | 6/2003 | Higashi et al. | |
| 2007/0215999 | A1 * | 9/2007 | Kashimoto et al. | 257/678 |
| 2010/0117219 | A1 | 5/2010 | Oka et al. | |

FOREIGN PATENT DOCUMENTS

| | | |
|---|---|---|
| DE | 34 12 651 A1 | 10/1985 |
| DE | 10 2006 051 454 A1 | 9/2007 |
| DE | 10 2008 029 829 A1 | 3/2010 |
| JP | 8-316357 | 11/1996 |
| JP | 2000-200804 | 7/2000 |
| JP | 2001-196495 | 7/2001 |
| JP | 2004-31417 | 1/2004 |
| JP | 2007-184315 | 7/2007 |
| JP | 2007-235004 | 9/2007 |
| WO | 2008/090731 A1 | 7/2008 |

OTHER PUBLICATIONS

U.S. Appl. No. 13/086,499, filed Apr. 14, 2011, Oi, et al.
U.S. Appl. No. 12/504,225, filed Jul. 16, 2009, Oi, et al.
U.S. Appl. No. 12/504,250, filed Jul. 16, 2009, Obiraki, et al.
U.S. Appl. No. 12/533,948, filed Jul. 21, 2009, Oka, et al.
U.S. Appl. No. 12/535,222, filed Aug. 4, 2009, Oka, et al.
U.S. Appl. No. 12/540,880, filed Aug. 13, 2009, Obiraki, et al.
U.S. Appl. No. 12/564,560, filed Sep. 22, 2009, Oka, et al.
U.S. Appl. No. 13/150,593, filed Jun. 1, 2011, Oka, et al.
German Office Action issued Aug. 3, 2011, in Patent Application No. 10 2009 055 691.5 (with English-language translation).

* cited by examiner

*Primary Examiner* — N Drew Richards
*Assistant Examiner* — Yu-Hsi D Sun
(74) *Attorney, Agent, or Firm* — Oblon, Spivak, McClelland, Maier & Neustadt, L.L.P.

(57) ABSTRACT

The power semiconductor module includes: a circuit substrate; power semiconductor elements joined to element mounting portions of the wiring pattern on the circuit substrate; the cylindrical external terminal communication section joined to the wiring pattern; circuit forming means for connecting between portions that require electrical connection therebetween; and transfer molding resin for sealing these components. The cylindrical external terminal communication section is a metal cylinder, and the cylindrical external terminal communication section has a hole filled with gel.

11 Claims, 6 Drawing Sheets

POWER SEMICONDUCTOR MODULE

BACKGROUND OF THE INVENTION

1. Field of the Invention

The present invention relates to a resin-sealed power semiconductor module, formed by transfer molding, which is excellent in terms of productivity. The present invention particularly relates to a resin-sealed power semiconductor module, formed by transfer molding, which is small in size, realizes large-current operation, and is highly reliable.

2. Description of the Background Art

One of the resin-sealed power semiconductor modules formed by transfer molding, which is small in size, capable of efficiently discharging to the outside the heat generated due to its operation, and capable of large-current operation, is the one in which: power semiconductor elements such as an IGBT and the like are mounted on a circuit pattern joined to a metal heat sink base; and main terminals and control terminals for external connection are joined to the circuit pattern so as to be substantially perpendicular to a surface of the circuit pattern.

A copper block, a cylinder having a screw hole, and a nut fixed by resin molding, are each used for a main terminal connected to a main circuit of this power semiconductor module. The main terminal that is a copper block is joined to external wiring by soldering. The main terminal that is a cylinder having a screw hole, or the main terminal in which a nut is fixed by resin molding, is connected to external wiring by a bolt. Further, as a terminal that connects the power semiconductor module to an external control circuit, a female connector is used in such a manner that a pin-type terminal provided on the control circuit is connected to the female connector (see, e.g., Page 7 to 9, FIGS. 2 and 6 of Japanese Laid-Open Patent Publication No. 2007-184315 (hereinafter, referred to as Patent Document 1)).

To the power semiconductor module sealed with resin by transfer molding, which is described in Patent Document 1, external wiring through which a large current is applied to the main terminal is fixed by thread connection or soldering. For this reason, the external wiring cannot be readily removed. Thus, there is a problem regarding repairability in a case where defects occur.

Patent Document 1 describes a connector configuration, of a control terminal of the power semiconductor module, to which a pin can be detachably connected. Accordingly, the problem of the power semiconductor module regarding repairability can be overcome by providing the main terminals of the power semiconductor module in the form of cylindrical external terminal communication sections each having such a structure as to allow an external terminal to be connected thereto by press-in connection, typically press fitting.

However, the power semiconductor module, in which the cylindrical external terminal communication sections are used as terminals to which external terminals are connected by press-in connection, has the following problem: even if the external terminals are already inserted into the cylindrical external terminal communication sections, when the power semiconductor module is used under the condition of high humidity, moisture enters the inside of the cylindrical external terminal communication sections; accordingly, corrosion occurs at the inside of the cylindrical external terminal communication sections and at a wiring pattern, causing deterioration in connections between the cylindrical external terminal communication sections and the external terminals; as a result, contact resistance and thermal resistance increase.

Also, even in a power semiconductor module which uses, as terminals, cylindrical external terminal communication sections to which external terminals are connected by soldering, there is a case where moisture enters a boundary between a cylindrical external terminal communication section and transfer molding resin. Accordingly, there is a problem that the outer wall of the cylindrical external terminal communication section and the wiring pattern are corroded.

SUMMARY OF THE INVENTION

The present invention solves the above problems. The object of the present invention is to provide a highly reliable power semiconductor module, sealed with resin by transfer molding, which is able to prevent, even when used under the condition of high humidity, moisture from entering the inside of the cylindrical external terminal communication sections and from reaching the outer walls of the cylindrical external terminal communication sections, thereby preventing corrosion at the inside or outer walls of the cylindrical external terminal communication sections and at the wiring pattern.

A power semiconductor module according to the present invention includes: a circuit substrate including a metal heat sink and including a high thermal conductive insulation layer joined to one surface of the metal heat sink and including a wiring pattern provided on a surface of the high thermal conductive insulation layer, which surface is opposite to a surface joined to the metal heat sink; power semiconductor elements joined to element mounting portions of the wiring pattern; a cylindrical external terminal communication section joined to the wiring pattern so as to be substantially perpendicular to the wiring pattern; circuit forming means for electrically connecting between the power semiconductor elements, electrically connecting between portions of the wiring pattern, and electrically connecting between the power semiconductor elements and the wiring pattern; and transfer molding resin for sealing at least the wiring pattern, the power semiconductor elements, the cylindrical external terminal communication section, and the circuit forming means. The cylindrical external terminal communication section is a metal cylinder, and the cylindrical external terminal communication section has a hole filled with gel.

Another power semiconductor module according to the present invention includes: a circuit substrate including a metal heat sink and including a high thermal conductive insulation layer joined to one surface of the metal heat sink and including a wiring pattern provided on a surface of the high thermal conductive insulation layer, which surface is opposite to a surface joined to the metal heat sink; power semiconductor elements joined to element mounting portions of the wiring pattern; a cylindrical external terminal communication section joined to the wiring pattern so as to be substantially perpendicular to the wiring pattern; circuit forming means for electrically connecting between the power semiconductor elements, electrically connecting between portions of the wiring pattern, and electrically connecting between the power semiconductor elements and the wiring pattern; and transfer molding resin for sealing at least the wiring pattern, the power semiconductor elements, the cylindrical external terminal communication section, and the circuit forming means. The cylindrical external terminal communication section is a metal cylinder, and plating is formed only on an inside of the cylindrical external terminal communication section, on portions thereof joined to the wiring pattern, and on portions thereof exposed from the transfer molding resin.

In the power semiconductor module according to the present invention, the cylindrical external terminal communication section is a metal cylinder, and the hole of the cylindrical external terminal communication section is filled with the gel. Therefore, even if the power semiconductor module is used under the condition of high humidity, moisture is prevented from entering the inside of the hole of the cylindrical external terminal communication section, whereby corrosion at the inside of the cylindrical external terminal communication section and at the wiring pattern can be prevented.

Further, in the other power semiconductor module according to the present invention, the cylindrical external terminal communication section is a metal cylinder, and plating is formed only on the inside of the cylindrical external terminal communication section, on the portion thereof joined to the wiring pattern, and on the portion thereof exposed from the transfer molding resin. Therefore, moisture is prevented from entering the boundary between the cylindrical external terminal communication section and the transfer molding resin, whereby corrosion at the outer wall of the cylindrical external terminal communication section and at the wiring pattern can be prevented.

The foregoing and other objects, features, aspects and advantages of the present invention will become more apparent from the following detailed description when read in conjunction with the accompanying drawings.

DETAILED DESCRIPTION OF THE PREFERRED EMBODIMENTS OF THE INVENTION

First Embodiment

Figure 1:
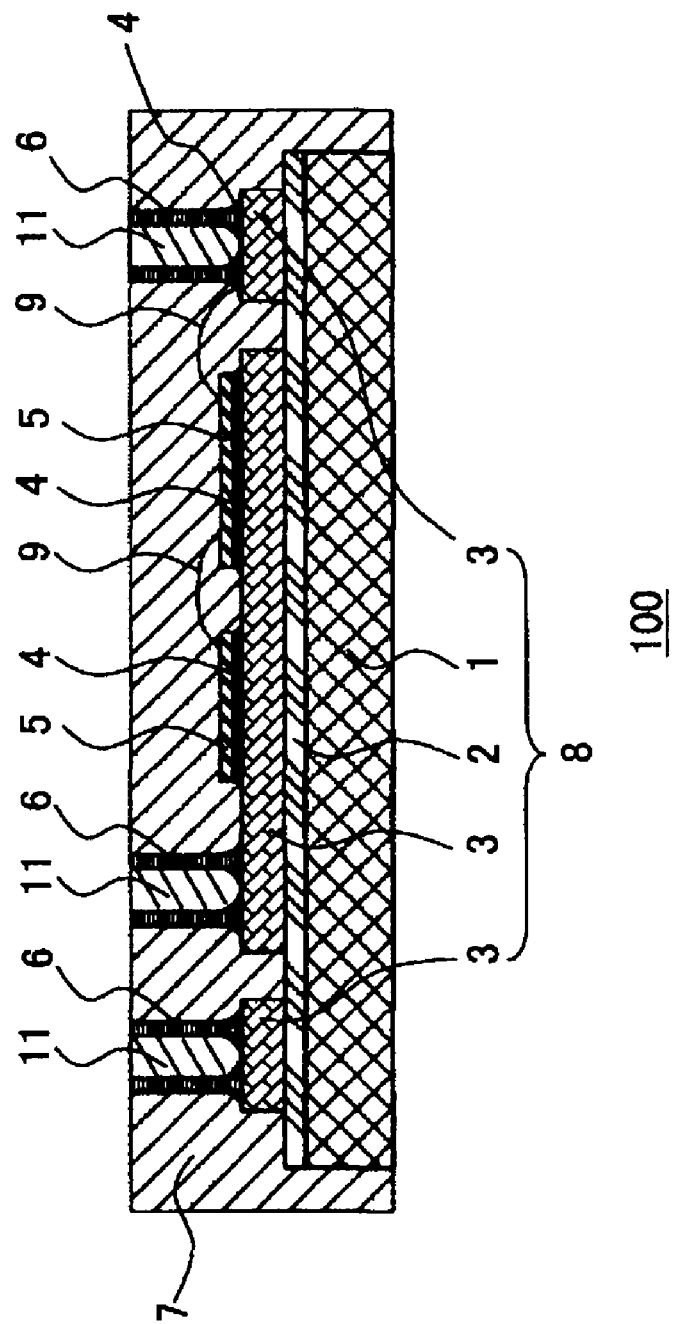
FIG. 1 is a schematic cross-sectional view showing a power semiconductor module according to the first embodiment of the present invention.

FIG. 1 is a schematic cross-sectional view showing a power semiconductor module according to the first embodiment of the present invention.

As shown in FIG. 1, in a power semiconductor module 100 of the present embodiment, a resin insulation layer 2, which is a high thermal conductive insulation layer, is provided on one surface of a metal plate 1 that acts as a metal heat sink for dissipating heat of the power semiconductor module 100. A metal foil wiring pattern 3 is provided on a surface of the resin insulation layer 2, which surface is opposite to a surface joined to the metal plate 1.

That is, the metal plate 1, the resin insulation layer 2 and the wiring pattern 3 constitute a metal circuit substrate 8.

Cylindrical external terminal communication sections 6 that act as terminals of the power semiconductor module 100 are joined, by solder 4, to the wiring pattern 3. In particular, the cylindrical external terminal communication sections 6 are provided on the wiring pattern 3 so as to be substantially perpendicular to the wiring pattern 3.

Connections are formed between portions of the wiring pattern 3, between power semiconductor elements 5, and between the wiring pattern 3 and the power semiconductor elements 5, by wire bonding 9 that is circuit forming means for electrically connecting these portions.

A surface of the metal circuit substrate 8, on which the wiring pattern 3 is formed; peripheral side surfaces of the metal circuit substrate 8; the power semiconductor elements 5; the wire bonding 9; and outer side surfaces of the cylindrical external terminal communication sections 6, are sealed with transfer molding resin 7. However, a surface of the metal plate 1, which is the opposite surface to a surface having the resin insulation layer 2 provided thereon, is not sealed with the transfer molding resin 7. Also, holes of the cylindrical external terminal communication sections 6 are not filled with the transfer molding resin 7.

However, in the present embodiment, the holes of the cylindrical external terminal communication sections 6 of the power semiconductor module 100 are filled with gel 11.

The penetration of the gel 11 used in the present embodiment is preferred to be approximately 40/10 mm to 150/10 mm. The gel 11 may be either conductive or insulating. In particular, use of conductive gel allows not only physical contact between external terminals and the cylindrical external terminal communication sections 6, but also conduction between the external terminals and the cylindrical external terminal communication sections 6 via the gel 11. Therefore, contact resistance between the external terminals and the cylindrical external terminal communication sections 6 is reduced, whereby current carrying capacity can be increased. Note that, however, even if insulating gel is used, sufficient electrical contact between the external terminals and the cylindrical external terminal communication sections 6 can be obtained since the penetration of the gel 11 is substantial.

Figure 2:
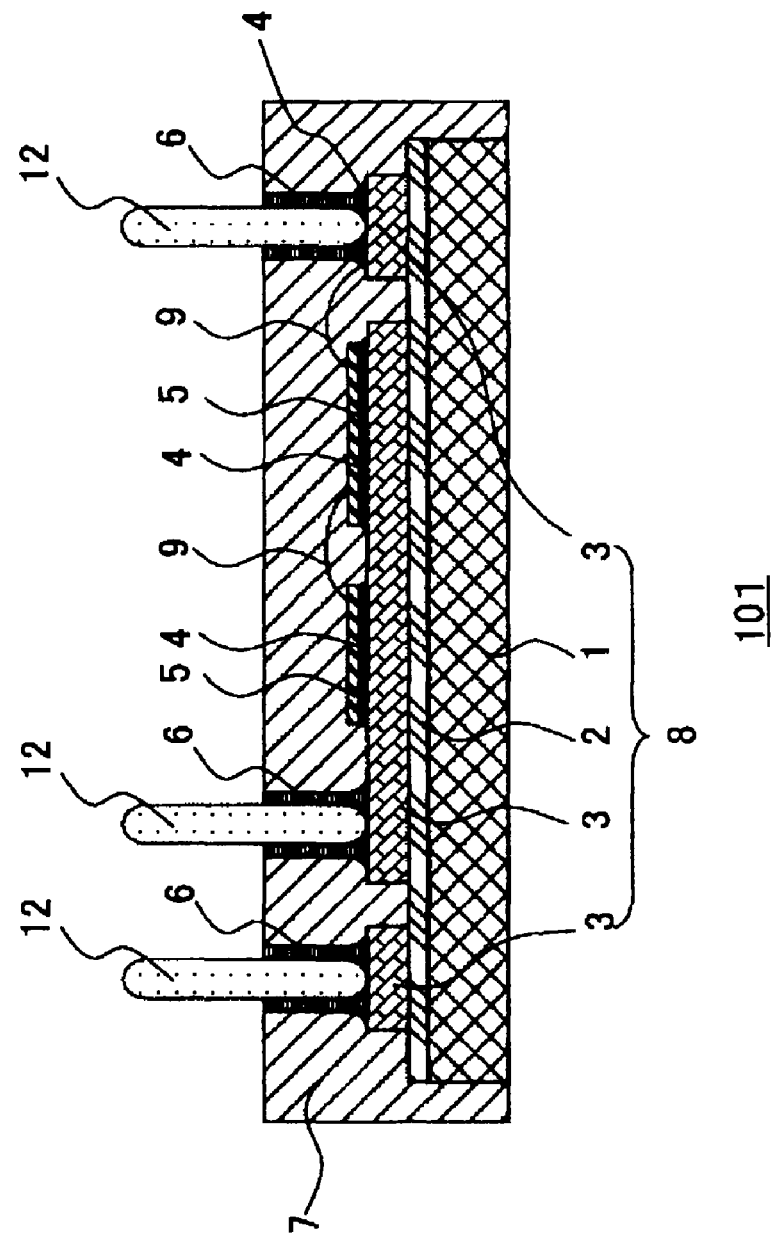
FIG. 2 is a schematic cross-sectional view showing that external terminals are inserted into cylindrical external terminal communication sections of the power semiconductor module according to the first embodiment of the present invention.

FIG. 2 is a schematic cross-sectional view of an external-terminal-fitted power semiconductor module 101 that is a result of inserting compliant pins, which act as external terminals 12, into the cylindrical external terminal communication sections 6 of the power semiconductor module 100 shown in FIG. 1. The compliant pins are connected to the cylindrical external terminal communication sections 6 of the power semiconductor module 100 by press-in connection, typically press fitting. The cylindrical external terminal communication sections 6 and the external terminals 12 are connected by metal-to-metal joint. In the present embodiment, the compliant pins are used as the external terminals. The external terminals used are not limited to compliant pins, but include anything that can be connected to the cylindrical external terminal communication sections 6 by press-in connection.

In the present embodiment, a metal plate having excellent thermal conductivity, for example, a metal plate formed of aluminum, aluminum alloy, copper, copper alloy, steel, steel alloy, or the like may be used as the metal plate 1. Alternatively, a composite material plate formed of a copper plate, an Fe—Ni alloy plate, and another copper plate; a composite material plate formed of an aluminum plate, an Fe—Ni alloy plate, and another aluminum plate; or the like may be used as the metal plate 1. In particular, in the case of using the metal plate 1 for the power semiconductor module 100 having a high current capacity, it is preferred to use copper having excellent thermal conductivity.

The thickness, length and width of the metal plate 1 are properly determined based on the current carrying capacity of the power semiconductor module 100. That is, the thickness, length and width of the metal plate 1 are increased in accordance with an increase in the current carrying capacity of the power semiconductor module 100.

In the present embodiment, used as the resin insulation layer 2 may be, for example, a resin insulation sheet containing various ceramics and inorganic powder, or a resin insulation sheet containing glass fiber. The inorganic powder contained in the resin insulation layer 2 is, for example, alumina, beryllia, boron nitride, magnesia, silica, silicon nitride, or aluminum nitride. The thickness of the resin insulation layer 2 is, for example, 20 to 400 μm.

In the present embodiment, for example, a copper foil is used for the wiring pattern 3, and aluminum wires are used for the wire bonding 9. The thickness of the copper foil used for the wiring pattern 3, and the diameter and the number of aluminum wires used for the wire bonding 9, are also properly determined based on the current carrying capacity of the power semiconductor module 100.

In the present embodiment, for example, metal cylinders each having a through hole are used as the cylindrical external terminal communication sections 6. It is preferred that a material used for the metal cylinders is, for example, a metal plated with copper, copper alloy, aluminum, aluminum alloy, or the like which has excellent thermal conductivity and electrical conductivity and which can be joined to the wiring pattern 3 by the solder 4. Plating used herein is, for example, Ni—Sn plating. Use of such plated metal allows the metal cylinders to be more firmly joined to the solder 4, and prevents oxidization of the surfaces of the metal cylinders.

The thickness of the cylindrical external terminal communication sections 6 is set so that the cylindrical external terminal communication sections 6 will not be crushed due to the molding pressure of the transfer molding. The thickness of the cylindrical external terminal communication sections 6 is properly set based on the current carrying capacity of the power semiconductor module 100. The height of the cylindrical external terminal communication sections 6 is set to such a height as to allow the external terminals 12, which are later inserted into the cylindrical external terminal communication sections 6, to be connected to the cylindrical external terminal communication sections 6 sufficiently.

Inner diameters of the cylindrical external terminal communication sections 6 are determined in accordance with outer diameters of insertion portions of the external terminals 12 that are later inserted and connected to the cylindrical external terminal communication sections 6. The inner diameters of the cylindrical external terminal communication sections 6 are determined so as to allow, at least, the external terminals 12 to be attached to the cylindrical external terminal communication sections 6. Inside each cylindrical external terminal communication section 6, the entrance portion of the hole may be chamfered such that the hole is widened at the chamfer. This allows the external terminals 12 to be readily inserted into the cylindrical external terminal communication sections 6.

In the present embodiment, a metal having excellent thermal conductivity and electrical conductivity is used for the external terminals 12 to be inserted into the cylindrical external terminal communication sections 6. In particular, a copper material is preferred. Cross-sectional sizes of the external terminals 12 are properly determined based on the current carrying capacity of the power semiconductor module 100.

In the present embodiment, for example, epoxy resin filled with silica powder filler is used as the transfer molding resin 7. In the transfer molding resin 7, the content percentage of the filled silica powder is determined to be an optimal amount in consideration of a thermal expansion coefficient or the like of each component used in the power semiconductor module 100.

For example, when copper is used for the wiring pattern 3 and the metal plate 1, the amount of silica powder filling the epoxy resin is set such that the thermal expansion coefficient of the transfer molding resin 7 coincides with the thermal expansion coefficient of the copper, that is, 16 ppm/° C. In this manner, a power semiconductor module, in which a warp does not occur, can be obtained.

In order to improve heat dissipation of the transfer molding resin 7, it is preferred to use alumina powder as the filler, instead of silica powder.

Described next is an example of a manufacturing method of the power semiconductor module of the present embodiment.

In manufacturing of the power semiconductor module 100 of the present embodiment, for example, an epoxy resin sheet containing B-stage alumina powder is placed on a 3 mm-thick aluminum plate, and a 0.3 mm-thick copper foil is superimposed thereon. Then, these are heated and pressurized so as to become joined to each other. Next, the wiring pattern 3 is formed by performing etching on the copper foil. In this manner, the metal circuit substrate 8 is formed, which includes: the aluminum metal plate 1; the resin insulation layer 2 formed of epoxy resin containing alumina powder; and the copper wiring pattern 3. Thereafter, although not shown, solder resist is formed at predetermined positions. This process is, however, not necessary.

Next, by using the solder 4, the power semiconductor elements 5 are joined to element mounting portions provided at predetermined positions on the wiring pattern 3, and the cylindrical external terminal communication sections 6 are joined to joining areas that are provided, for the cylindrical external terminal communication sections 6, at predetermined positions on the wiring pattern 3. At this point, plating has already been performed on the cylindrical external terminal communication sections 6.

Then, between portions of the wiring pattern 3, between the power semiconductor elements 5, and between the wiring pattern 3 and the power semiconductor elements 5, positions that require conduction therebetween are connected via the aluminum wire bonding 9.

In the present embodiment, positions that require conduction therebetween are connected via the wire bonding 9. However, these positions may not necessarily be connected via the wire bonding. Other means capable of electrically connecting these positions may be used instead.

Next, the metal circuit substrate 8, on which the wire-bonded power semiconductor elements 5 and the cylindrical external terminal communication sections 6 are mounted, is set into a mold and then sealed by a transfer molding method with the transfer molding resin 7 that is of, for example, an epoxy resin type filled with silica powder. Then, the gel 11 is injected into the holes of the cylindrical external terminal communication sections 6, which are open at the outer surface of the transfer molding resin 7. In this manner, the power semiconductor module 100 is completed.

In the manufacturing method of the power semiconductor module 100 of the present embodiment, the wire bonding is performed between predetermined components after all the components such as the power semiconductor elements 5 and the cylindrical external terminal communication sections 6 are joined, by soldering, to the wiring pattern 3 of the metal circuit substrate 8. However, the wire bonding may be performed between the predetermined components after all the power semiconductor elements 5 are joined to the wiring pattern 3 of the metal circuit substrate 8. Then, after the wire bonding is performed, the cylindrical external terminal communication sections 6 may be joined to the wiring pattern 3.

In the above manner, operations of a wire bonding equipment are not restricted even when the cylindrical external terminal communication sections 6 having a considerable height are used, and the wire bonding can be performed near the cylindrical external terminal communication sections 6. Thus, an increase in dimensions of an area on which the components of the power semiconductor module are mounted, can be prevented even when the cylindrical external terminal communication sections 6 having a considerable height are used. This allows the power semiconductor module to be further reduced in size.

In this manufacturing method, since the cylindrical external terminal communication sections 6 are joined to the wiring pattern 3 on which the power semiconductor elements 5 have previously been joined, the cylindrical external terminal communication sections 6 are joined by using low-melting solder, or in a different manner from soldering. Instead of soldering, the cylindrical external terminal communication sections 6 may be joined to the wiring pattern 3 by means of, for example, silver paste bonding or ultrasonic bonding.

In the power semiconductor module 100 of the present embodiment, the cylindrical external terminal communication sections 6, to which the external terminals 12 are to be connected, are provided on the wiring pattern surface of the metal circuit substrate 8. Therefore, the external terminals 12 that are compliant pins can be connected to the cylindrical external terminal communication sections 6 by press-in connection such as press fitting. In other words, the external terminals 12 can be readily removed from the cylindrical external terminal communication sections 6. Thus, the power semiconductor module 100 is excellent in terms of repairability.

Further, in the power semiconductor module 100 of the present embodiment, the holes of the cylindrical external terminal communication sections 6 are filled with the gel 11. For this reason, even if the power semiconductor module is used under the condition of high humidity, moisture can be prevented from entering the inside of the cylindrical external terminal communication sections 6, whereby corrosion at the inside of the cylindrical external terminal communication sections 6 and at the wiring pattern 3 can be prevented.

Still further, the power semiconductor module 101 of the present embodiment is also excellent in terms of the contact between the cylindrical external terminal communication sections 6 and the external terminals 12, and contact resistance and thermal resistance are low.

Still further, although the metal circuit substrate is used as a circuit substrate of the power semiconductor module 100 of the present embodiment, a ceramic circuit substrate may be used instead. For example, the ceramic circuit substrate includes: a ceramic plate that is a high thermal conductive insulation layer; a copper wiring pattern provided on one surface of the ceramic plate; and a copper metal heat sink provided on the other surface of the ceramic plate.

Second Embodiment

Figure 3:
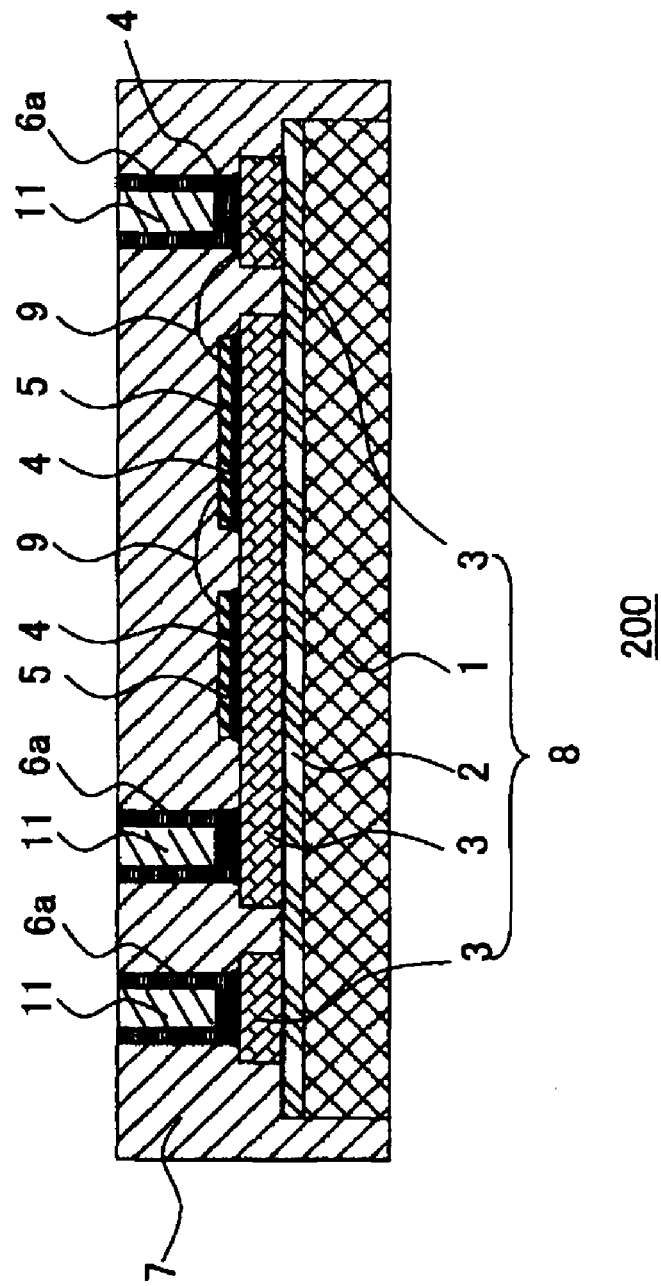
FIG. 3 is a schematic cross-sectional view showing a power semiconductor module according to the second embodiment of the present invention.

FIG. 3 is a schematic cross-sectional view showing a power semiconductor module according to the second embodiment of the present invention.

As shown in FIG. 3, a power semiconductor module 200 of the present embodiment is the same as the power semiconductor module 100 of the first embodiment, except that cylindrical external terminal communication sections 6a are each provided with, at one end thereof joined to the wiring pattern 3, a bottom body.

Figure 4:
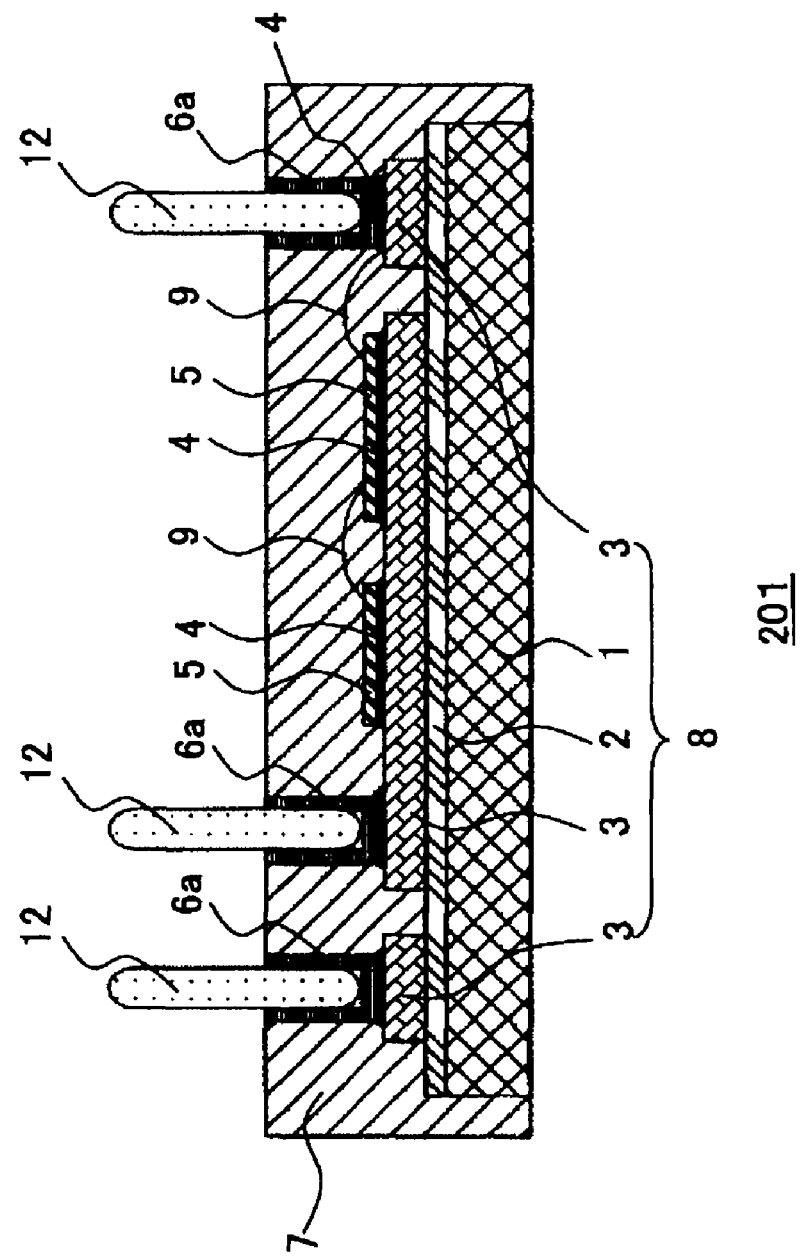
FIG. 4 is a schematic cross-sectional view showing that external terminals are inserted into cylindrical external terminal communication sections of the power semiconductor module according to the second embodiment of the present invention.

FIG. 4 is a schematic cross-sectional view showing that external terminals are inserted into the cylindrical external terminal communication sections of the power semiconductor module according to the second embodiment of the present invention.

An external-terminal-fitted power semiconductor module 201 shown in FIG. 4 is a result of inserting the external terminals 12, which are compliant pins, into the cylindrical external terminal communication sections 6a of the power semiconductor module 200.

In the power semiconductor module 200 of the present embodiment, the cylindrical external terminal communication sections 6a, to which the external terminals 12 are to be connected, are provided on the wiring pattern surface of the metal circuit substrate 8. Therefore, the external terminals 12 that are compliant pins can be connected to the cylindrical external terminal communication sections 6a by press-in connection such as press fitting. Since the external terminals 12 are connected to the cylindrical external terminal communication sections 6a by press-in connection, the external terminals 12 can be readily removed from the cylindrical external terminal communication sections 6a. Thus, the power semiconductor module 200 is excellent in terms of repairability.

Further, in the power semiconductor module 200 of the present embodiment, the holes of the cylindrical external terminal communication sections 6a are filled with the gel 11. For this reason, even if the power semiconductor module is used under the condition of high humidity, moisture can be prevented from entering the inside of the cylindrical external terminal communication sections 6a, whereby corrosion at the inside of the cylindrical external terminal communication sections 6a can be prevented.

Still further, the power semiconductor module 201 of the present embodiment is also excellent in terms of the contact between the cylindrical external terminal communication sections 6a and the external terminals 12, and contact resistance and thermal resistance are low.

Still further, since the bottom bodies of the cylindrical external terminal communication sections 6a are joined to the wiring pattern 3, the joints between the cylindrical external terminal communication sections 6a and the wiring pattern 3 are large in size. Accordingly, soldering therebetween is sufficiently firm. This improves reliability at the joints between the cylindrical external terminal communication sections 6a and the wiring pattern 3.

Third Embodiment

Figure 5:
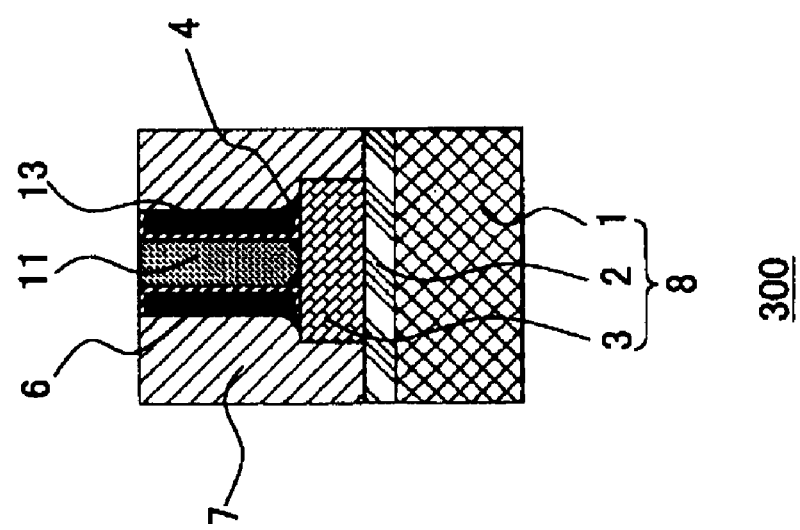
FIG. 5 is a schematic partial cross-sectional view of an area encompassing a cylindrical external terminal communication section of a power semiconductor module according to the third embodiment of the present invention.

FIG. 5 is a schematic partial cross-sectional view of an area encompassing a cylindrical external terminal communication section of a power semiconductor module according to the third embodiment of the present invention.

As shown in FIG. 5, a power semiconductor module 300 of the present embodiment is the same as the power semiconductor module 100 of the first embodiment, except that plating 13 is formed only on the inside of the cylindrical external terminal communication sections 6, on portions thereof joined to the wiring pattern 3, and on portions thereof exposed from the transfer molding resin 7.

In the present embodiment, it is preferred that the plating 13, which is formed on the inside of the cylindrical external terminal communication sections 6, on the portions thereof joined to the wiring pattern 3, and on the portions thereof exposed from the transfer molding resin 7, is nickel plating or tin plating.

The power semiconductor module 300 of the present embodiment provides the same effects as those of the power semiconductor module 100 of the first embodiment. In addition, since the plating 13 is formed only on the inside of the cylindrical external terminal communication sections 6, on the portions thereof joined to the wiring pattern 3, and on the portions thereof exposed from the transfer molding resin 7, adhesiveness between the cylindrical external terminal communication sections 6 and the transfer molding resin 7 is excellent. Accordingly, a gap does not occur at the boundaries therebetween, and moisture does not enter the boundaries. Thus, improved sealing reliability is obtained, and corrosion at the outer walls of the cylindrical external terminal communication sections 6 and at the wiring pattern 3 can be prevented.

Forming the plating 13 only on the inside of the cylindrical external terminal communication sections 6, on the portions thereof joined to the wiring pattern 3, and on the portions thereof exposed from the transfer molding resin 7, is also applicable to the power semiconductor module 200 of the second embodiment. In this manner, the same effects as those of the power semiconductor module 300 can be obtained.

Fourth Embodiment

Figure 6:
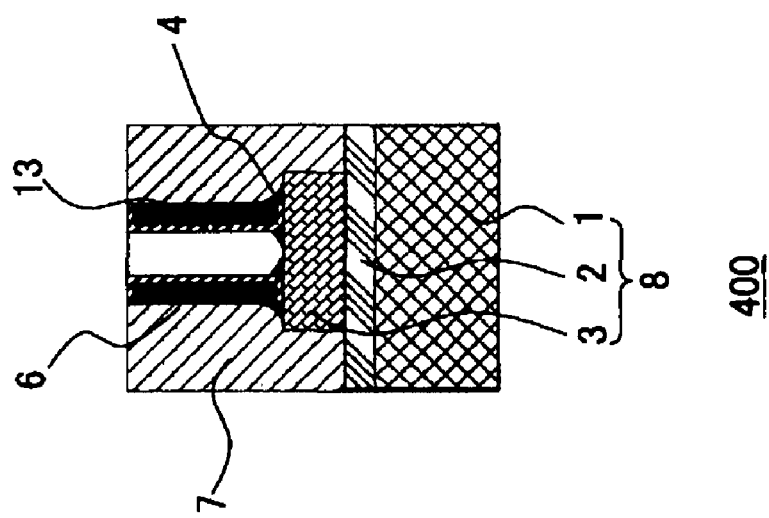
FIG. 6 is a schematic partial cross-sectional view of an area encompassing a cylindrical external terminal communication section of a power semiconductor module according to the fourth embodiment of the present invention.

FIG. 6 is a schematic partial cross-sectional view of an area encompassing a cylindrical external terminal communication section of a power semiconductor module according to the fourth embodiment of the present invention.

As shown in FIG. 6, a power semiconductor module 400 of the present embodiment is the same as the power semiconductor module 300 of the third embodiment, except that the holes of the cylindrical external terminal communication sections 6 are not filled with the gel 11, that is, the cylindrical external terminal communication sections 6 have vacant holes.

The power semiconductor module 400 of the present embodiment provides the same effects as those of the power semiconductor module 300 of the third embodiment, by joining the external terminals 12 to the cylindrical external terminal communication sections 6 via soldering.

Since the external terminals 12 are joined via soldering in the power semiconductor module 400 of the present embodiment, any metal bodies, which can be inserted and soldered to the cylindrical external terminal communication sections 6, can be used as the external terminals 12.

The power semiconductor module according to the present invention is able to prevent moisture from entering the inside of the cylindrical external terminal communication sections of the power semiconductor module and from reaching the outer walls of the cylindrical external terminal communication sections, thereby preventing corrosion at the inside and outer walls of the cylindrical external terminal communication sections and at the wiring pattern. Therefore, the power semiconductor module according to the present invention can be effectively utilized as a power semiconductor device that is required to be highly reliable.

Various modifications and alterations of this invention will be apparent to those skilled in the art without departing from the scope and spirit of this invention, and it should be understood that this is not limited to the illustrative embodiments set forth herein.

What is claimed is:

1. A power semiconductor module comprising:
a circuit substrate including a metal heat sink and including a thermal conductive insulation layer joined to one surface of the metal heat sink and including a wiring pattern provided on a surface of the thermal conductive insulation layer, which surface is opposite to a surface joined to the metal heat sink;
power semiconductor elements joined to element mounting portions of the wiring pattern;
a cylindrical external terminal communication section joined to the wiring pattern so as to be substantially perpendicular to the wiring pattern;
circuit forming means for electrically connecting between the power semiconductor elements, electrically connecting between portions of the wiring pattern, and electrically connecting between the power semiconductor elements and the wiring pattern; and
transfer molding resin for sealing at least the wiring pattern, the power semiconductor elements, the cylindrical external terminal communication section, and the circuit forming means, wherein
the cylindrical external terminal communication section is a metal cylinder, and
the cylindrical external terminal communication section has a hole fully filled with gel so that an external terminal is able to be interchangeably press fitted into the hole.

2. The power semiconductor module of claim 1, wherein:
plating is formed only on an inside of the cylindrical external terminal communication section, on a portion thereof joined to the wiring pattern, and on a portion thereof exposed from the transfer molding resin.

3. The power semiconductor module according to claim 1, wherein
plating is formed only on an inside of the cylindrical external terminal communication section, on a portion thereof joined to the wiring pattern, and on a portion thereof exposed from the transfer molding resin.

4. The power semiconductor module according to claim 1, wherein the circuit substrate is a metal circuit substrate including:
a metal plate that is the metal heat sink;
a resin insulation layer that is the thermal conductive insulation layer joined to one surface of the metal plate; and
the wiring pattern provided on a surface of the resin insulation layer, which surface is opposite to a surface joined to the metal plate.

5. The power semiconductor module according to claim 1, wherein the circuit substrate is a ceramic circuit substrate including:
a ceramic plate that is the thermal conductive insulation layer;
a metal foil that is the metal heat sink joined to one surface of the ceramic plate; and
the wiring pattern provided on another surface of the ceramic plate.

6. The power semiconductor module according to claim 1, wherein a bottom body is provided at one end, of the cylindrical external terminal communication section, joined to the wiring pattern.

7. The power semiconductor module according to claim 1, wherein an external terminal is connected to the cylindrical external terminal communication section.

8. The power semiconductor module according to claim 2, wherein the circuit substrate is a metal circuit substrate including:
   a metal plate that is the metal heat sink;
   a resin insulation layer that is the thermal conductive insulation layer joined to one surface of the metal plate; and
   the wiring pattern provided on a surface of the resin insulation layer, which surface is opposite to a surface joined to the metal plate.

9. The power semiconductor module according to claim 2, wherein the circuit substrate is a ceramic circuit substrate including:
   a ceramic plate that is the thermal conductive insulation layer;
   a metal foil that is the metal heat sink joined to one surface of the ceramic plate; and
   the wiring pattern provided on another surface of the ceramic plate.

10. The power semiconductor module according to claim 2, wherein a bottom body is provided at one end, of the cylindrical external terminal communication section, joined to the wiring pattern.

11. The power semiconductor module according to claim 2, wherein an external terminal is connected to the cylindrical external terminal communication section.

* * * * *